(12) United States Patent
Gaide et al.

(10) Patent No.: US 12,653,050 B2
(45) Date of Patent: Jun. 9, 2026

(54) MEMORY BANDWIDTH THROUGH VERTICAL CONNECTIONS

(71) Applicant: XILINX, INC., San Jose, CA (US)

(72) Inventors: Brian C. Gaide, Erie, CO (US);
Sagheer Ahmad, Cupertino, CA (US);
Aman Gupta, Sunnyvale, CA (US)

(73) Assignee: XILINX, INC., San Jose, CA (US)

( * ) Notice: Subject to any disclaimer, the term of this
patent is extended or adjusted under 35
U.S.C. 154(b) by 412 days.

(21) Appl. No.: 18/199,334

(22) Filed: May 18, 2023

(65) Prior Publication Data

US 2024/0387388 A1      Nov. 21, 2024

(51) Int. Cl.
*H10W 70/65*        (2026.01)
*H10B 80/00*        (2026.01)
*H10W 70/60*        (2026.01)
*H10W 90/00*        (2026.01)
*H10W 90/20*        (2026.01)

(52) U.S. Cl.
CPC ............ *H10W 70/65* (2026.01); *H10B 80/00*
(2023.02); *H10W 70/611* (2026.01); *H10W*
*90/00* (2026.01); *H10W 90/297* (2026.01)

(58) Field of Classification Search
CPC ... H10W 70/65; H10W 70/611; H10W 90/00;
H10W 90/297; H10B 80/00; H01L 25/18;
H01L 25/0657; H01L 23/5386; H01L
2225/06513; H01L 2225/06517; H01L
2225/06541; H01L 2225/06544
See application file for complete search history.

(56) References Cited

U.S. PATENT DOCUMENTS

| | | | | |
|---|---|---|---|---|
| 8,922,243 | B2 * | 12/2014 | Jayasena | ............ H03K 19/1776 |
| | | | | 326/38 |
| 12,190,038 | B1 * | 1/2025 | Farjadrad | .............. G06F 30/392 |
| 2014/0177626 | A1 * | 6/2014 | Thottethodi | ........ H01L 25/0652 |
| | | | | 257/774 |
| 2014/0181428 | A1 * | 6/2014 | Hsu | ...................... G06F 12/0246 |
| | | | | 711/154 |
| 2015/0016172 | A1 * | 1/2015 | Loh | ......................... G11C 5/025 |
| | | | | 365/51 |
| 2015/0199126 | A1 * | 7/2015 | Jayasena | ............ G06F 12/0292 |
| | | | | 711/170 |
| 2023/0050383 | A1 * | 2/2023 | Brewer | ............... G06F 9/30185 |
| 2024/0047364 | A1 | 2/2024 | Blair | |
| 2024/0088099 | A1 * | 3/2024 | Prasad | .................... G11C 5/025 |
| 2025/0251878 | A1 * | 8/2025 | Norman | .............. G06F 13/4282 |

* cited by examiner

*Primary Examiner* — Dao H Nguyen
(74) *Attorney, Agent, or Firm* — Patterson + Sheridan,
LLP

(57)                    ABSTRACT

Embodiments herein describe a memory controller (MC) in
a first integrated circuit (IC) that connect to circuitry in the
same integrated circuit (e.g., horizontal direction) and to
circuitry in a second IC in the vertical direction. That is, the
first and second ICs can be stacked on each other where the
MC in the first IC provides an interface for both circuitry in
the first IC as well as circuitry in the second IC to commu-
nicate with a separate memory device. Thus, the MC
includes data paths in both the X direction (e.g., within the
same IC) and the Y direction (e.g., to an external IC). In this
manner, the MC can provide an interface for circuitry in
multiple ICs (or dies or chiplets) to the same external
memory device.

18 Claims, 6 Drawing Sheets

MEMORY BANDWIDTH THROUGH VERTICAL CONNECTIONS

TECHNICAL FIELD

Examples of the present disclosure generally relate to coupling a memory controller in one integrated circuit in the vertical direction to circuitry disposed on a second integrated circuit.

BACKGROUND

Many devices include multiple integrated circuits (or dies, chips, or chiplets) that are interconnected on a substrate or interposer. Planar programmable device architectures are limited in their ability to include additional services, e.g., hardened interconnects, due to the disruption any non-programmable fabric logic causes to the regular structures. Including hardened interconnects, memories, or microcontrollers displace core compute elements (look-up tables (LUTs), digital signal processors (DSPs), and interconnect fabric), worsening the timing characteristics and quality of the primary function of a device. For devices with high speed I/O at the periphery (e.g., high bandwidth memory (HBM) or Serializer/Deserializer (SerDes)), distribution of the I/O bandwidth to the compute elements spread across the device area is challenging. A hardened solution cannot be extended to deliver the full I/O bandwidth without harming the core function of the device. Thus, the same interconnect fabric used for global communication is also used for local compute implementation, necessitating a monolithically compiled field programmable gate array (FPGA) design.

Using an FPGA design, however, to provide access to a HBM can limit the bandwidth. For example, the interface between the FPGA and a memory controller may be limited, which can in turn limit the memory access for other circuitry in the integrated circuit that rely on the FPGA to access the HBM. Put differently, the interface between the FPGA and the memory controller can become a bottleneck that limits the ability to fully use the bandwidth of the HBM.

SUMMARY

One embodiment described herein is a package that includes a memory device, a first integrated circuit (IC) that includes a memory controller (MC) and first circuitry where the MC is coupled to the memory device, and a second IC that includes second circuitry coupled to the MC using vertical connections where both the first circuitry in the first IC and the second circuitry in the second IC rely on the MC to access the memory device.

One embodiment described herein is an IC that includes a MC configured to couple to a memory device that is external to the IC and internal circuitry. The internal circuitry in the IC and external circuitry in a different IC rely on the MC to access the memory device, wherein the MC is configured to use vertical connections to communicate with the external circuitry and horizontal connections to communicate with the internal circuitry.

One embodiment described herein is a package that includes a memory device, a first IC that includes a MC and first circuitry coupled to the MC using a first set of connections where the MC is coupled to the memory device, and a second IC that includes second circuitry coupled to the MC using a second set of connections where both the first circuitry in the first IC and the second circuitry in the second IC rely on the MC to access the memory device.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
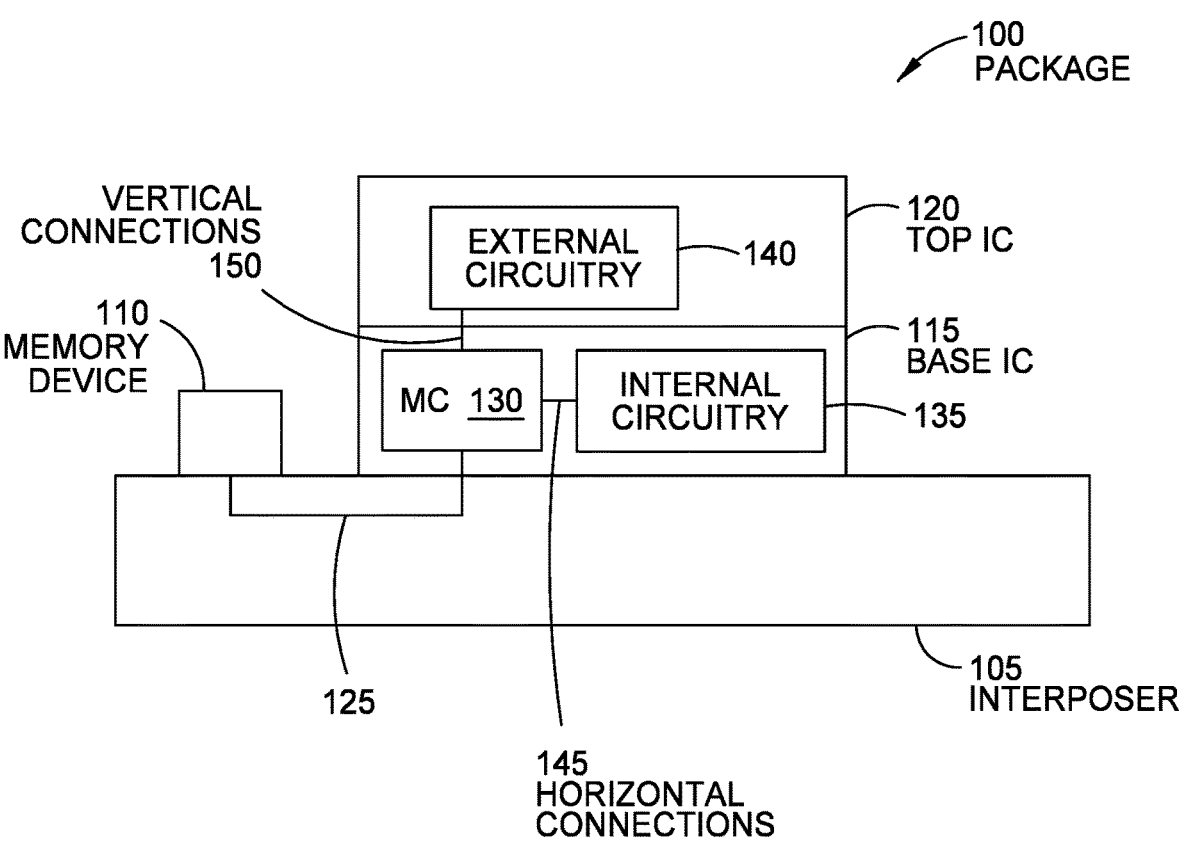
FIG. 1 illustrates a package with a memory controller with vertical and horizontal connections, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe memory controllers in a first integrated circuit (IC) that connect to circuitry in the same integrated circuit (e.g., horizontal direction) and to circuitry in a second IC in the vertical direction. That is, the first and second ICs can be stacked on each other where the memory controller (MC) in the first IC provides an interface for both circuitry in the first IC and circuitry in the second IC. Thus, the MC includes data paths in both the horizontal direction (e.g., within the same IC) and the vertical direction (e.g., to an external stacked IC). In this manner, the MC can provide an interface for circuitry in multiple ICs (or dies or chiplets) to the same external memory device (e.g., a HBM).

In one embodiment, the IC containing the MC is disposed on an interposer with a memory device (e.g., an HBM stack). The interposer can provide chip-to-chip connections that permit the MC to communicate with the memory device. The MC can then include intra-IC connections to communicate with circuitry in the same IC (e.g., processing elements, programmable fabric (e.g., a FPGA), network on a chip (NoC), and the like). The MC can also include inter-IC connections to a different IC (e.g., an upper IC in a stack) to communicate with circuitry in that IC, such as a processing elements, programmable fabric, or NoC. In this manner, the MC can have both vertical and horizontal connections to circuitry.

In one embodiment, the bandwidth may be unequal between the vertical and horizontal connections. For example, the interface between the MC and the circuitry in the same IC (e.g., the horizontal connections) may be limited due to limited number of interface elements. For example, the MC may have a limited number of interconnect pins to an programmable fabric in the same IC. However, the vertical connections (which can include an array of through silicon vias) may provide much greater bandwidth. As such, circuitry that uses a greater amount of the bandwidth of the memory device may be placed in the IC above the MC to take advantage of the higher bandwidth vertical connections, while the circuitry that uses a smaller amount of the bandwidth can be disposed in the same IC as the MC and use the limited bandwidth horizontal connections.

FIG. 1 illustrates a package 100 with a MC 130 with vertical and horizontal connections, according to an example. As shown, the package 100 (or system) includes an interposer 105 (e.g., a silicon interposer or a printed circuit board (PCB)) on which a memory device 110 and a base IC 115 are disposed. In one embodiment, the memory device 110 is a separate memory that can be formed from one IC (or die) or multiple ICs. In one embodiment, the memory device 110 is a High Bandwidth Memory (HBM). HBMs are themselves a stack of DRAM dies with an optional base die. The DRAM dies in the HBMs can be interconnected by through-silicon vias (TSVs) and microbumps. Thus, in that scenario, the memory device 110 can include a plurality of ICs or dies, where the bottom die in the stack is connected to the interposer 105.

The base IC 115 includes the MC 130 and internal circuitry 135. The MC 130 is coupled to the memory device 110 using chip-to-chip connections 125. In one embodiment, Universal Chiplet Interconnect Express (UCIe) can be used to form the chip-to-chip (or die-to-die) connections 125, which has a physical layer that supports up to 32 GT/s with 16 to 64 lanes. However, the embodiments herein are not limited to any particular chip-to-chip communication standard.

The MC 130 is connected to the internal circuitry 135 in the base IC 115 using horizontal connections 145. These horizontal connections 145 can be an internal interface (e.g., an input/output (I/O) interface) within the base IC 115. The horizontal connections 145 can be traces, switching circuitry, a routing network (e.g., a NoC), and the like. In any case, the MC 130, the connections 145, and the internal circuitry 135 are in the same IC or die.

The internal circuitry 135 can be any circuitry that wants to access the memory device 110. That is, the circuitry 135 can be any circuitry that wants to write data to and/or read data from the memory device 110. The internal circuitry 135 can be a hardened processing element, a processing element implemented in programmable logic, internal memory in the base IC 115, and the like. The MC 130 serves as an intermediary between the internal circuitry 135 and the memory device 110.

In addition to the horizontal connection 145, the MC 130 also has vertical connections 150 to external circuitry 140 in the top IC 120. The circuitry 140 is called "external"

circuitry because it is located in a different IC or die than the MC 130. That is, the MC 130 serves as an intermediary between both the internal circuitry 135 and the external circuitry 140 to the memory device 110. Some reasons for putting the internal circuitry 135 and the external circuitry 140 on different dies (rather than on the same die) can include that the internal circuitry 135 and the external circuitry 140 might be on different technologies (e.g., one is a 7 nm process and the other is a 3 nm process), or that 3D stacking enables minimal latency to both the internal circuitry 135 and the external circuitry 140 from the MC 130. In contrast, a planar arrangement may have wires that route a longer distance to get to one of the internal circuitry 135 or the external circuitry 140.

The vertical connections 150 extends through an interface between the top IC 120 and the base IC 115. As such, the vertical connection 150 can be referred to as a chip-to-chip connection. In one embodiment, the top IC 120 and the base IC 115 are wafer bonded together in order to form the vertical connection 150 between the two ICs. However, in other embodiments, the top IC 120 and base IC 115 may be bonded using other types of connection techniques such as microbumps or copper pillars. Different arrangements for connecting the external circuitry 140 in the top IC 120 to the MC 130 in the base IC 115 are discussed in FIGS. 2-4.

The external circuitry 140 can be any circuitry that wants to access the memory device 110. That is, the circuitry 140 can be any circuitry that wants to write data to and/or read data from the memory device 110. The external circuitry 140 can be a hardened processing element, a processing element implemented in programmable logic, internal memory in the top IC 120, and the like. The MC 130 serves as an intermediary between the external circuitry 140 and the memory device 110.

In one embodiment, the vertical connection 150 is made using at least one through silicon via (TSV). In some embodiments, the base IC 115 includes a TSV. In one embodiment, the top IC 120 includes a TSV. In yet another embodiment, both the base IC 115 and the top IC 120 include a TSV. Further, in one embodiment, the vertical connections 150 may include an array of TSVs in the base IC 115, the top IC 120, or both.

In one embodiment, the bandwidth provided by the horizontal connection 145 is different from the bandwidth provided by the vertical connection 150. This may be due to a design choice by the chip designer, or because of inherent limitations of the connections. For example, if the internal circuitry 135 is a programmable logic fabric, the interface between the fabric and the MC 130 may offer less bandwidth than TSV technology used to route data between the MC 130 and the external circuitry 140. While the embodiments herein typically describe the horizontal connections 145 as offering lower bandwidths than the vertical connections 150, the reverse could also be true. In yet other embodiments, the bandwidths of the vertical and horizontal connections 145, 150 could be equal.

The type (or size) of the internal circuitry 135 and the external circuitry 140 may depend on the bandwidth of the horizontal and vertical connections 145 and 150. For example, if the vertical connections 150 offer greater bandwidth, then circuitry that requires more access to the memory device 110 may be disposed in the top IC 120, while circuitry that does not access the memory device 110 as much may be disposed in the base IC 115. Stated generally, if the system designer has two different types of circuitry that should be part of the package 100 that both use the memory device 110, the designer can place the circuitry that requires more bandwidth to access the memory device 110 in the IC with the higher bandwidth connection to the MC 130, whether that is the top IC 120 which uses the vertical connections 150 to communicate with the MC 130 or the base IC 115 which uses the horizontal connections 145 to communicate with the MC 130.

Figure 2:
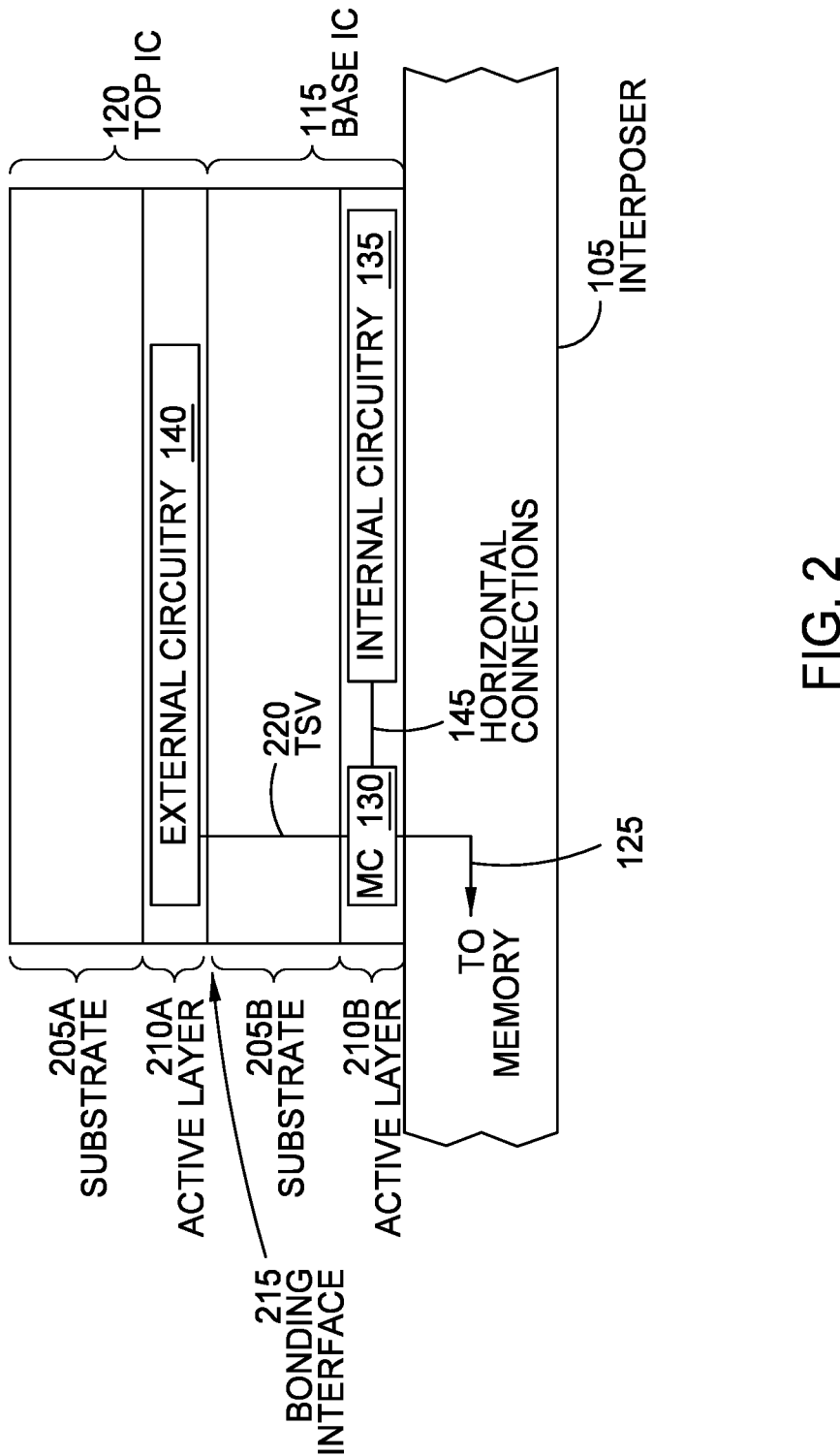
FIG. 2 illustrates connecting a memory controller to circuitry in both vertical and horizontal directions, according to an example.

FIG. 2 illustrates connecting the MC 130 to circuitry in both vertical and horizontal directions, according to an example. FIG. 2 illustrates wafer bonding the top IC 120 to the base IC 115 at a bonding interface 215. In one embodiment, the wafer bond is a hybrid wafer bond where the bonding interface 215 includes oxide-to-oxide bonds and metal-to-metal bonds. The metal-to-metal bonds can establish electrical paths for the vertical connections between the MC 130 in the base IC 115 and the external circuitry 140 in the top IC 120.

The top IC 120 includes a substrate 205A and an active layer 210A. The substrate can be a semiconductor substrate (e.g., silicon) while the active layer 210A can be processed to include different circuitry—i.e., the external circuitry 140. Although not shown, the top IC 120 may include an oxide layer (e.g., a buried oxide layer (BOX)) between the substrate 205A and the active layer 210A. In one embodiment, the substrate 205A may be much thicker than the active layer 210A. However, in one embodiment, the substrate 205A may be thinned down after the top IC 120 has been bonded to the base IC 115.

The base IC 115 also includes a substrate 205B and an active layer 210B, where the active layer 210B includes the MC 130, the horizontal connections 145, and the internal circuitry 135. The base IC 115 may also include a BOX layer between the substrate 205B and the active layer 210B.

In this example, the substrate 205B of the base IC 115 is wafer bonded to the active layer 210A of the top IC 120. As such, to make a vertical connection, the base IC 115 includes a TSV 220 that extends through the substrate 205B. That is, the TSV 220 connects the MC 130 to the active layer 210A of the top IC 120 at the bonding interface 215, such that the vertical connection passes through the bonding interface 215. For example, the top of the TSV 220 may make a metal connection with a metal pad in the active layer 210. One or more metal routing layers in the active layer 210 can connect the TSV 220 to the external circuitry 140.

While FIG. 2 illustrates one TSV 220, the MC 130 can be coupled to the external circuitry 140 using an array of TSVs 220 that extend through the substrate 205B and couple to the active layer 210A at the bonding interface 215.

Also, the active layer 210B of the base IC 115 is in a facing relationship with the interposer 105. This way, the MC 130 can be coupled to the chip-to-chip connections 125 which couple the MC 130 to the memory device (not shown).

Figure 3:
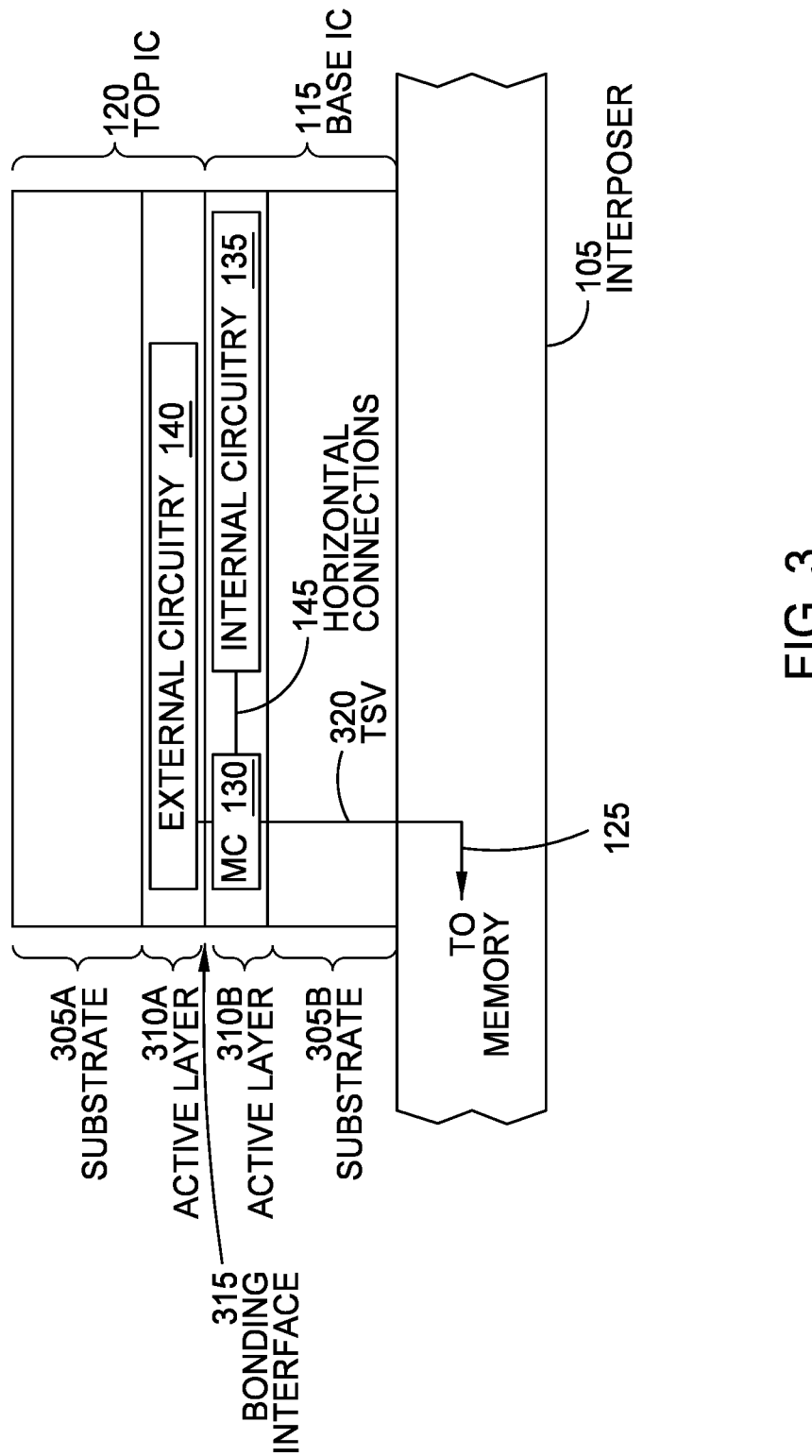
FIG. 3 illustrates connecting a memory controller to circuitry in both vertical and horizontal directions, according to an example.

FIG. 3 illustrates connecting the MC 130 to circuitry in both vertical and horizontal directions, according to an example. Like in FIG. 2, FIG. 3 illustrates wafer bonding the top IC 120 to the base IC 115 at a bonding interface 315. In one embodiment, the wafer bond is a hybrid wafer bond where the bonding interface 315 includes oxide-to-oxide bonds and metal-to-metal bonds which can establish electrical paths for the vertical connections between the MC 130 in the base IC 115 and the external circuitry 140 in the top IC 120.

The top IC 120 includes a substrate 305A and an active layer 310A. The substrate can be a semiconductor substrate (e.g., silicon) while the active layer 310A can be processed to include different circuitry. Although not shown, the top IC 120 may include a BOX layer. The base IC 115 also includes a substrate 305B and an active layer 310B which may be electrical isolated by a BOX layer.

In this example, active layer 310A of the top IC 120 is wafer bonded to the active layer 310B of the base IC 115. As such, to make a vertical connection in this example, a TSV may not be needed. Instead, a metal pad (or a plurality of metal pads) in the active layer 310A of the top IC 120 can be bonded to a metal pad (or a plurality of metal pads) in the active layer 310B in the base IC 115. The metal pads in the active layer 310A and the active layer 310B may be connected to metal routing layers in the active layers 310 that electrical couple the MC 130 to the external circuitry 140.

In this example, the substrate 305B of the base IC 115 is in a facing relationship with the interposer 105. As such, the active layer 310B is space apart from the interposer 105 by the substrate 305B. In this embodiment, a TSV 320 connects the MC 130 to the interposer 105. For example, the bottom of the TSV 220 may make a metal connection with a microbump or pillar at the bottom of the base IC 115 in order to connect to the chip-to-chip connection 125.

While FIG. 3 illustrates one TSV 320, the MC 130 can be coupled to the memory device using an array of TSVs 320 that extend through the substrate 305B and couple to chip-to-chip connections 125 in the interposer 105.

Figure 4:
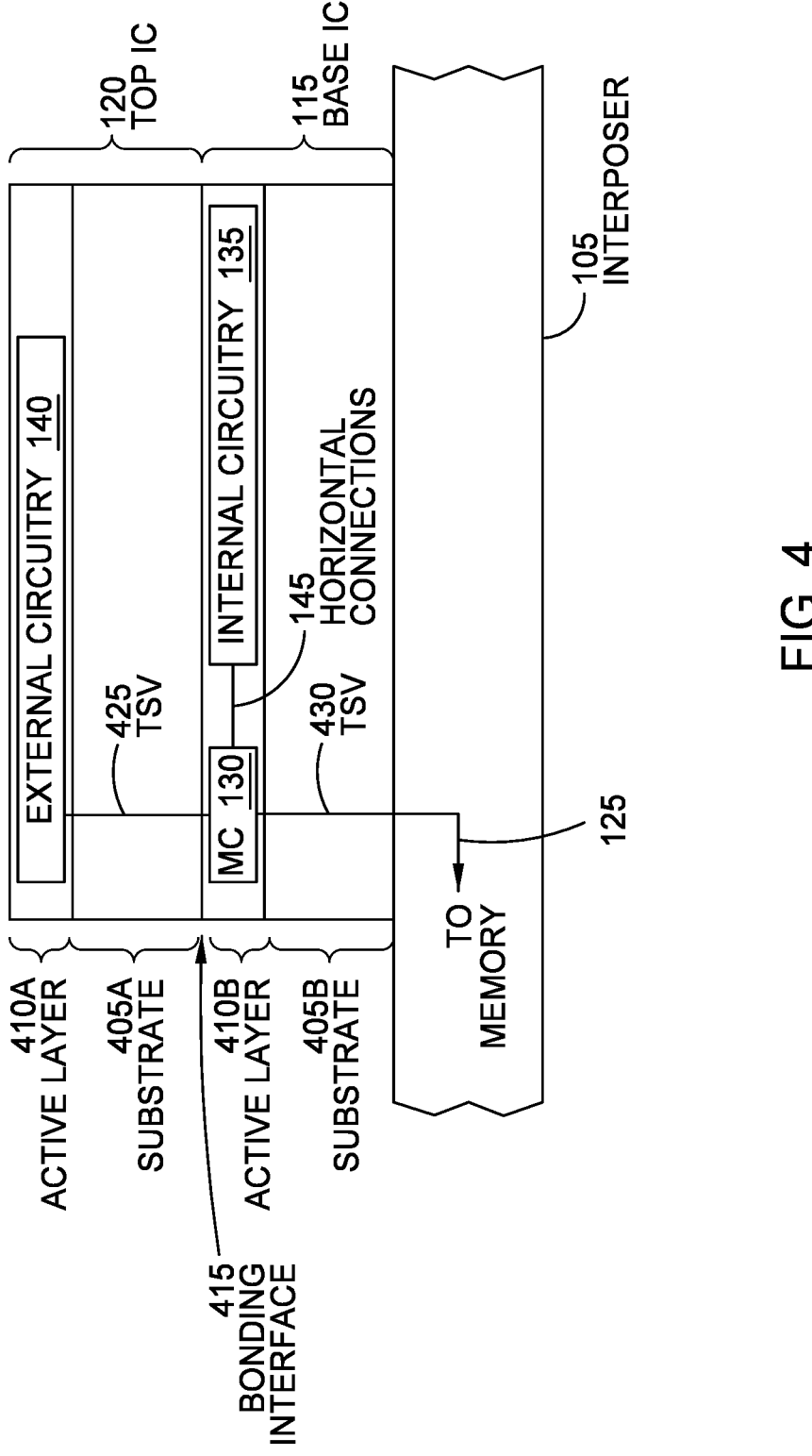
FIG. 4 illustrates connecting a memory controller to circuitry in both vertical and horizontal directions, according to an example.

FIG. 4 illustrates connecting the MC 130 to circuitry in both vertical and horizontal directions, according to an example. Like in FIGS. 2 and 3, FIG. 4 illustrates wafer bonding the top IC 120 to the base IC 115 at a bonding interface 415. In one embodiment, the wafer bond is a hybrid wafer bond where the bonding interface 415 includes oxide-to-oxide bonds and metal-to-metal bonds which can establish electrical paths for the vertical connections between the MC 130 in the base IC 115 and the external circuitry 140 in the top IC 120.

The top IC 120 includes a substrate 405A and an active layer 410A. The substrate can be a semiconductor substrate (e.g., silicon) while the active layer 410A can be processed to include different circuitry. Although not shown, the top IC 120 may include a BOX layer between the active layer 410A and the substrate 405A. The base IC 115 also includes a substrate 405B and an active layer 410B which may be electrical isolated by a BOX layer.

In this example, the active layer 410B of the base IC 115 is wafer bonded to the substrate 405A of the top IC 120. As such, to make a vertical connection, the top IC 120 includes a TSV 420 that extends through the substrate 405A. That is, the TSV 420 connects the MC 130 to the active layer 410A of the top IC 120. For example, the bottom of the TSV 420 may make a metal connection with a metal pad in the active layer 410B of the base IC 115. The TSV 420 then extends through the top IC 120 until reaching the active layer 410A where it is electrically connected to the external circuitry 140. For example, one or more metal routing layers in the active layer 410A can connect the TSV 420 to the external circuitry 140.

While FIG. 4 illustrates one TSV 420, the MC 130 can be coupled to the external circuitry 140 using an array of TSVs 420 that extend through the substrate 405A and couple the active layer 410A in the top IC 120 to the active layer 410B in the base IC 115.

In FIG. 4, the substrate 405B of the base IC 115 is in a facing relationship with the interposer 105. As such, the active layer 410B is spaced apart from the interposer 105 by the substrate 405B. In this example, a TSV 430 connects the MC 130 to the interposer 105. For example, the bottom of the TSV 430 may make a metal connection with a microbump or pillar at the bottom of the base IC 115 in order to connect to the chip-to-chip connection 125.

While FIG. 4 illustrates one TSV 430, the MC 130 can be coupled to the memory device using an array of TSVs 430 that extend through the substrate 405B and couple to chip-to-chip connections 125 in the interposer 105.

Moreover, while FIGS. 2-4 illustrate wafer bonding the top IC 120 to the base IC 115, this is just one example of connecting the two ICs. Other chip-to-chip stacking techniques can be used to connect the two ICs and form the vertical connections between the MC 130 in the base IC 115 and the external circuitry 140 in the top IC 120. For example, the two ICs can be connected electrically and physically using microbumps or copper pillars.

Figure 5:
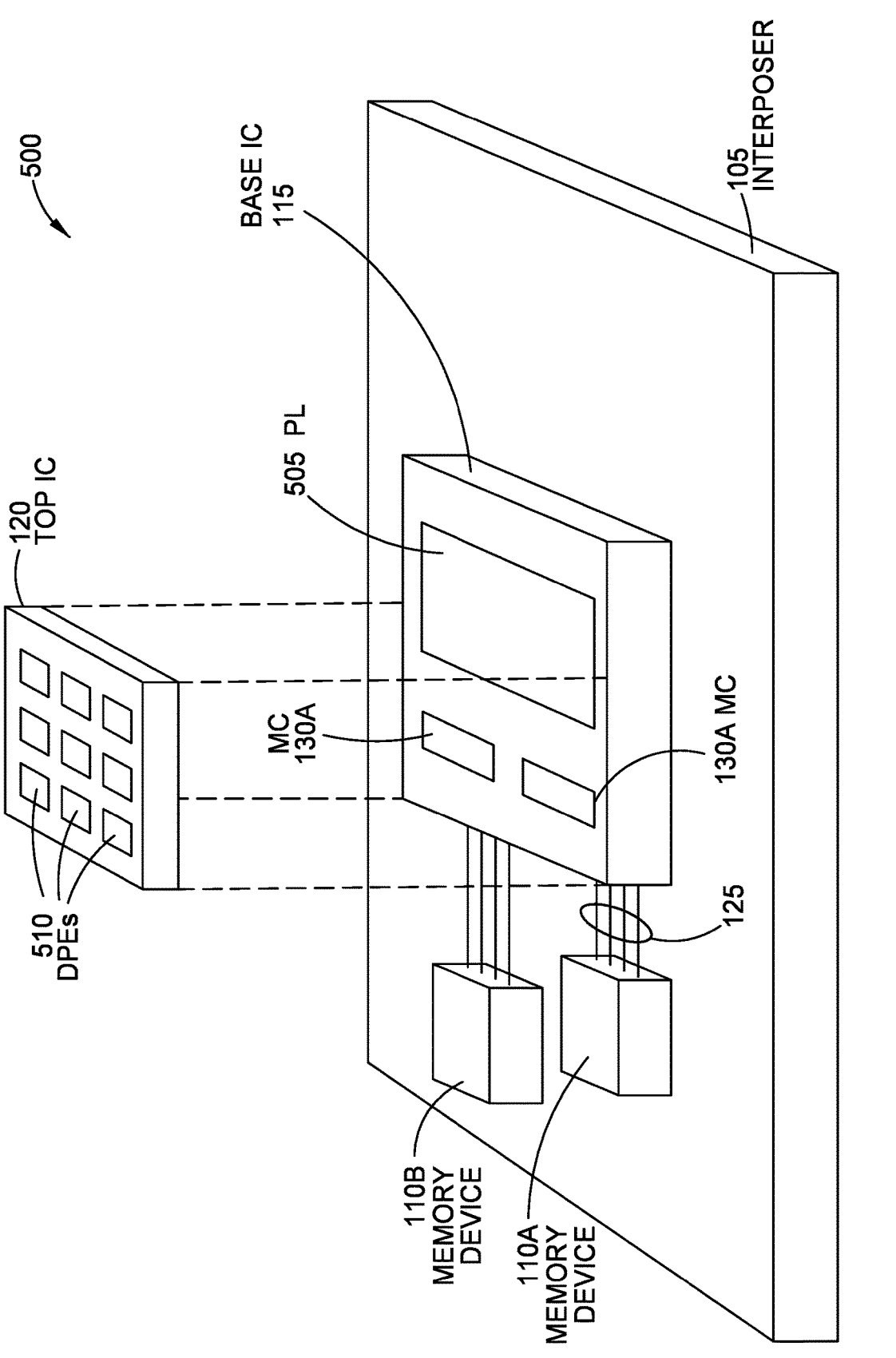
FIG. 5 illustrates a stack of dies on an interposer, according to an example.

FIG. 5 illustrates a stack of dies on an interposer 105, according to an example. The stack of dies may be part of a package 500 that includes connecting multiple memory devices (e.g., memory device 110A and 110B) to the base IC 115. For example, the memory devices 110 may be HBMs.

In this embodiment, the base IC 115 include multiple MCs 130A and 130B. Each of the MC 130 can be connected to a respective one of the memory devices 110 using multiple chip-to-chip connections 125.

In this example, the base ICs 115 include programmable logic (PL) which can form a PL fabric. The PL 505 may use the MCs 130 to access the memory devices 110. That is, although not shown, the base IC 115 can include horizontal connections (as discussed above) which can communicatively link the MCs 130 to the PL 505.

FIG. 5 illustrates an exploded view where the top IC 120 is shown as floating over the base IC 115. As discussed, the top IC 120 can be attached to the base IC 115 using wafer bonding, microbumps, copper pillars, or other suitable die staking technologies.

In one embodiment, the MCs 130 are connected to at least one data processing engine (DPE) 510 in the top IC 120. The top IC 120 includes a plurality of DPEs 510. The plurality of DPEs 510 can be arranged in a grid, cluster, or checkerboard pattern in the top IC 120. Although FIG. 5 illustrates arranging the DPEs 510 in a 2D array with rows and columns, the embodiments are not limited to this arrangement. Further, the array of DPEs 510 can be any size and have any number of rows and columns formed by the DPEs 510.

In one embodiment, the DPEs 510 are identical. That is, each of the DPEs 510 (also referred to as tiles or blocks) may have the same hardware components or circuitry. Further, the embodiments herein are not limited to DPEs 510. Instead, the top IC 120 can include an array of any kind of processing elements, for example, the DPEs 510 could be digital signal processing engines, cryptographic engines, Forward Error Correction (FEC) engines, or other specialized hardware for performing one or more specialized tasks.

In FIG. 5, the top IC 120 includes DPEs 510 that are all the same type (e.g., a homogeneous array). However, in another embodiment, the DPEs 510 may include different types of engines, but may have the same size. For example, the top IC 120 may include digital signal processing engines, cryptographic engines, graphic processing engines, and the like where each of these hardware elements takes up the same amount of space on the top IC 120. Regardless if the DPEs 510 are homogenous or heterogeneous, the DPEs 510 can include direct connections between DPEs 510 which permit the DPEs 510 to transfer data directly. The DPEs 510 can also have connections to the underlying MCs 130 in the base IC 115 using vertical connection which may, or may not, include TSVs.

In one embodiment, the DPEs 510 are formed from software-configurable hardened logic—i.e., are hardened. Using hardened logic circuitry to form the hardware elements in the DPE 510 such as program memories, an instruction fetch/decode unit, fixed-point vector units, floating-point vector units, arithmetic logic units (ALUs), multiply accumulators (MAC), and the like can significantly reduce the footprint of the array of DPEs 510 in the top IC 120. Although the DPEs 510 may be hardened, this does not mean the DPEs 510 are not programmable. That is, the DPEs 510 can be configured when the top IC 120 is powered on or rebooted to perform different functions or tasks, or can be runtime-configurable where their function is changed while running.

In one embodiment, only a subset of the DPEs 510 are connected to the MCs 130. For example, the vertical connections between the two ICs may couple only the DPEs 510 in the leftmost column to the underlying MCs 130. Nonetheless, due to the DPEs 510 having connections to each other, DPEs 510 that are not connected to the vertical connections may nonetheless be able to communicate with the MCs 130 (and then access memory devices 110) using the DPEs 510 that are connected to the vertical connections. In this manner, circuitry in the top IC 120 that is not connected to the vertical connections can still use the MCs 130 to access the memory devices 110. However, in another embodiment, all of the DPEs 510 in the top IC 120 may be connected to vertical connections which couple the DPEs 510 to the MCs 130.

FIG. 5 illustrates that the top IC 120 has different dimensions than the base IC 115. As illustrated by the dotted lines in FIG. 5, the top IC 120 has a smaller width than the base IC 115, but in other embodiments, the top IC 120 may have both a smaller length and a smaller width than the base IC 115. However, in other embodiments, the top IC 120 may be larger than the base IC 115 (e.g., a larger width, a larger length, or both).

Figure 6:
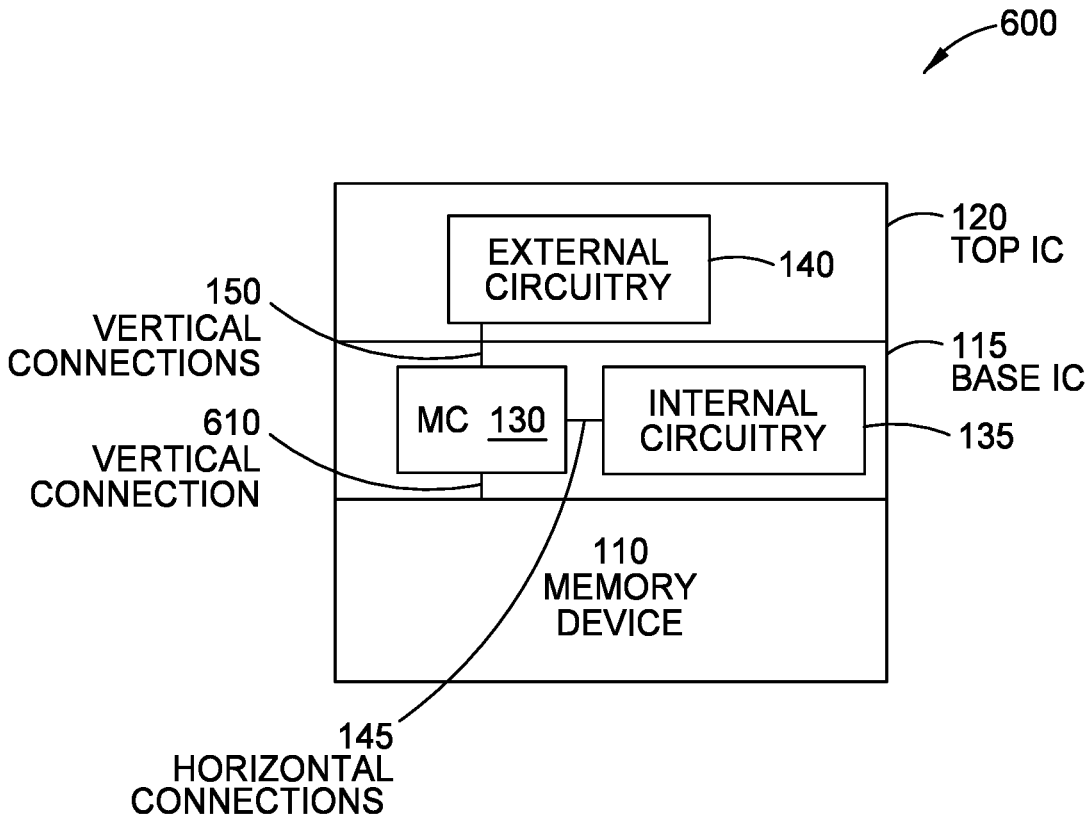
FIG. 6 illustrates a stack of dies, according to an example.

FIG. 6 illustrates a stack of dies, according to an example. That is, FIG. 6 illustrates a package 600 that does not use an interposer to couple the memory device 110 to an IC 605 containing the MC 130. That is, in this example, the IC 605 containing the MC 130 is no longer the "base" IC since the IC 605 is stacked on the memory device 110.

Rather than using an interposer, the MC 130 is connected to the memory device 110 using vertical connections 610. This vertical connection 610 may include TSVs that extend through the memory device 110, the IC 605, or both. However, in other embodiment, the vertical connection 610 may be formed without using any TSVs if, e.g., an active layer of the memory device 110 is in a facing relationship with an active layer of the IC 605 that includes the MC 130.

The memory device 110 may be connected to the IC 605 using any suitable chip stacking technology such as wafer bonding, microbumps, copper pillars, etc.

Like above, the package 600 still includes an MC 130 that is coupled both to internal circuitry 135 in the same IC 605 using the horizontal connections 145 and to external circuitry 140 in the top IC 120 using the vertical connections 150. The top IC 120 and the IC 605 can be arranged like any of the embodiments shown in FIGS. 2-4. These permutations are not repeated here.

One advantage of the package 600 is that an interposer may be omitted. However, one disadvantage of stacking the IC 605 on the memory device 110 is that typically it is advantageous to put the IC 605 containing the I/O (e.g., the MC 130) in the bottom die of a stack. In this case, the IC 605 would not be at the bottom of the stack where the I/O circuitry in the IC 605 can easily be coupled to other dies, besides the memory device 110.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A package, comprising:
a memory device;
a first integrated circuit (IC) comprising a memory controller (MC) and first circuitry, wherein the MC is coupled to the memory device; and
a second IC comprising second circuitry coupled to the MC using vertical connections, wherein both the first circuitry in the first IC and the second circuitry in the second IC rely on the MC to access the memory device,
wherein the first IC and the memory device are disposed on an interposer, wherein the interposer includes chip-to-chip connections between the memory device and the first IC.

2. The package of claim 1, wherein the MC is coupled to the memory device using chip-to-chip connections.

3. The package of claim 1, wherein the vertical connections coupling the MC to the second circuitry include at least one through silicon via (TSV) that extends through a substrate of the first IC or the second IC.

4. The package of claim 1, wherein a bandwidth of the vertical connections is different from a bandwidth of horizontal connections coupling the MC to the first circuitry.

5. The package of claim 4, wherein the bandwidth of the vertical connections is greater than the bandwidth of the horizontal connections.

6. The package of claim 1, wherein the first IC is wafer bonded to the second IC, wherein the vertical connections pass through a bonding interface between the first and second ICs.

7. The package of claim 1, wherein the memory device comprises an high bandwidth memory (HBM).

8. The package of claim 1, wherein the first IC is stacked on the memory device, wherein the first IC is disposed between the memory device and the second IC.

9. The package of claim 1, wherein the first IC and the second IC have different dimensions.

10. An integrated circuit (IC), comprising:
a memory controller (MC) configured to couple to a memory device that is disposed on a same interposer as the IC, wherein the MC is configured to communicate with the memory device using chip-to-chip connections in the interposer; and
internal circuitry, wherein the internal circuitry in the IC and external circuitry in a different IC rely on the MC to access the memory device, wherein the MC is configured to use vertical connections to communicate with the external circuitry and horizontal connections to communicate with the internal circuitry.

11. The IC of claim 10, wherein the vertical connections coupling the MC to the external circuitry include at least one through silicon via (TSV).

12. The IC of claim 10, wherein a bandwidth of the vertical connections is different from a bandwidth of the horizontal connections.

13. The IC of claim 12, wherein the bandwidth of the vertical connections is greater than the bandwidth of the horizontal connections.

14. A package, comprising:
a memory device;
a first integrated circuit (IC) comprising a memory controller (MC) and first circuitry coupled to the MC using a first set of connections, wherein the MC is coupled to the memory device; and
a second IC comprising second circuitry coupled to the MC using a second set of connections, wherein both the first circuitry in the first IC and the second circuitry in the second IC rely on the MC to access the memory device,
wherein the first IC and the memory device are disposed on an interposer, wherein the interposer includes chip-to-chip connections between the memory device and the first IC, and wherein the second IC is stacked on the first IC.

15. The package of claim 14, wherein the MC is coupled to the memory device using chip-to-chip connections.

16. The package of claim 14, wherein the second set of connections coupling the MC to the second circuitry include at least one through silicon via (TSV) that extends through a substrate of the first IC or the second IC.

17. The package of claim 14, wherein a bandwidth of the second set of connections is different from a bandwidth of the first set of connections.

18. The package of claim 14, wherein the first IC is wafer bonded to the second IC, wherein the second set of connections passes through a bonding interface between the first and second ICs.

* * * * *